United States Patent
Manapat et al.

(10) Patent No.: US 6,876,563 B1
(45) Date of Patent: Apr. 5, 2005

(54) METHOD FOR CONFIGURING CHIP SELECTS IN MEMORIES

(75) Inventors: Rajesh Manapat, San Jose, CA (US); Sunil Koduru, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 117 days.

(21) Appl. No.: 10/327,221

(22) Filed: Dec. 20, 2002

(51) Int. Cl.⁷ .............................................. G11C 5/06
(52) U.S. Cl. ..................... 365/63; 365/191; 365/189.02
(58) Field of Search ..................... 365/63, 191, 189.02, 365/189.12, 189.01, 189.07, 230.02, 230.03, 185.11, 189.09

(56) References Cited

U.S. PATENT DOCUMENTS

| | | | | |
|---|---|---|---|---|
| 5,781,492 A | * | 7/1998 | Gittinger et al. | 365/230.01 |
| 5,872,940 A | * | 2/1999 | Circello et al. | 710/305 |
| 6,097,211 A | * | 8/2000 | Couts-Martin et al. | 326/40 |
| 6,229,727 B1 | * | 5/2001 | Doyle | 365/63 |
| 6,577,535 B2 | * | 6/2003 | Pasternak | 365/185.11 |
| 6,601,130 B1 | * | 7/2003 | Silvkoff et al. | 711/5 |
| 2002/0131318 A1 | * | 9/2002 | Ayukawa et al. | 365/230.03 |
| 2003/0051118 A1 | * | 3/2003 | Wu et al. | 711/202 |

* cited by examiner

*Primary Examiner*—Anh Phung
*Assistant Examiner*—Dang Nguyen
(74) *Attorney, Agent, or Firm*—Wagner, Murabito & Hao LLP

(57) ABSTRACT

Embodiments of the present invention relate to an electronic device having programmable chip enable inputs in that each chip enable has a programmable assertion level, e.g., high or low. The device may be an integrated memory chip, e.g., SRAM device. On power up, a JTAG input port of the electronic device can be used to program a configuration register which contains bits for setting the assertion level of each chip enable input. The bits may be used to control respective multiplexers which select between a chip enable signal and its inverse. The chip enable signals may originate from a controller device. Regarding a memory device, the outputs of the multiplexers are coupled to chip enable signals of an integrated memory core. The pre-configurable chip selects comprise chip select pins which are individually configured to active-high or active-low configurations so that the number of selectable memory chips requires only a number of chip selects equal to the number of times a memory is doubled, plus one chip select.

20 Claims, 4 Drawing Sheets

METHOD FOR CONFIGURING CHIP SELECTS IN MEMORIES

FIELD OF THE INVENTION

Embodiments of the present invention relate to the field of computer memory devices.

BACKGROUND OF THE INVENTION

Chip selection or addressing in memories generally requires selecting a particular chip from an array of many. To do this usually requires that each chip in a bank or array of chips have a set of chip selects that respond to a unique address from a memory controller of some kind.

Since memory chips are usually identical and chip enable signals are permanently hard wired (e.g., active-high or active-low) a chip requires a large number of chip selects in order to respond to a unique address. Normally, the number of chip selects is equal to the number of times the chip count is doubled in an array of chips, plus one. This can be expressed as (2n+1), where 'n' is the number of times the chip count has been doubled, i.e., where the chip count equals $2^n$. This scheme limits the number of chips that can be effectively accommodated by a given number of chip selects in a memory device.

Currently, synchronous SRAMs include 2 or more chip select pins, which enable a user to activate or de-activate the device, thereby allowing access to the memory within the device. The chip select pins are also used when interfacing the SRAMs in a system, where the memory size needs to be increased. These pins allow the system to turn on one part of the memory (SRAM chip) while turning off the other part of the memory.

Conventional art FIG. 1 shows an example of how four SRAMs are used for enabling access of a memory size four times the size of each memory device. Each device has identical chip select assertion levels. As shown, 5 chip selects are needed for this type of interface. One of the chip selects is used to control the whole bank and the rest to control each of the devices independently. It can be seen that two of the chip selects in each of the devices are not utilized and are permanently grounded or powered up to the supply voltage. The reason for this is because all of the chip selects are alike in each SRAM and four combinations of chip selects are needed to select one of the SRAMs.

Conventional art FIG. 1 illustrates an implementation of this existing memory selection scheme. Each memory chip 101 to 104 is implemented with five chip selects, CE1 through CE5. In each chip, chip selects CE2 and CE4 are active high, and ship selects /CE1, /CE3, and /CE5 are active low, as indicated by the leading "/". Vdd is always high and is connected to one or two pins in three of the four illustrated chips. Ground is also connected to one or two pins in three of the four chips. Memory controller 110 is capable of outputting three high or low chip select signals, and thus is capable of writing a three bit word of "000", "001", "010", or "011" to access chips 101 through 104, respectively, where /CE1 selects the entire bank.

The extra chip selects not used by the controller are coupled to a "high" or to a ground, therefore each chip must have five chip selects in order to be able to address four chips. Addressing eight chips requires six chips selects and so on, in accord with the above expression (2n+1).

To formalize the conventional art generally, (2n+1) chip selects are needed on each of the SRAMs for effective expanding of the memory 2n times, where 'n' is the number of times the memory needs to be doubled in a compounded fashion or, expressed differently, where the number of selectable chips is equal to $2^n$. The extra chip select for which '1' accounts is generally used for selecting or de-selecting the entire bank or array of chips.

SUMMARY OF THE INVENTION

Accordingly, embodiments of the present invention are directed to a novel method and system for configuring and selecting chip selects, e.g., in memories, which enable increasing the size of a memory bank with a limited number of available chip selects per memory chip.

Embodiments of the present invention are directed to a memory device having a set of configurable chip selects wherein the assertion level, e.g., asserted high or asserted low, of each chip select can be programmed uniquely for each device. In this way, a circuit device, e.g., a memory device, can have a unique set of chip selects, e.g., chip select levels, for individually addressing the device and this unique set of chip selects can be programmed into the device. In one embodiment, a JTAG port of a device can be used to program the chip select levels of the device. By using this novel chip elect configuration, the invention reduces the number of chip select pins for a given depth expansion scheme. It is appreciated that use of JTAG is but one example, and any method of programming the chip select levels may be employed.

Embodiments of the present invention also relate to a method for addressing computer memory chips having programmable chip select levels which comprises configuring a set of chip selects for such a memory chip, storing the configuration data in a data register, accessing the chip select configuration data, receiving a chip select signal, combining the chip select signal and the chip select configuration data to produce active chip selects, and enabling the memory chip in accordance with the combined data and address. The pre-configured chip selects comprise chip select pins which are individually configured, e.g., programmable, to active-high or active-low configurations so that the number of selectable memory chips requires only a number of chip selects equal to the number of times a memory size is doubled, e.g., n, plus one chip select or n+1.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The operation and components of this invention can be best visualized by reference to the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it should be understood by one of ordinary skill in the art that the present invention may be practiced without these specific details. In other instances, well-known methods, procedures, components, and circuits have not been described in detail so as not to unnecessarily obscure aspects of the present invention. At times, concepts disclosed in this discussion of embodiments of the present invention will be made more readily apparent by reference to the Figures.

The method for configuring and selecting chip selects presented in this embodiment of the present invention provides for having a device with configurable chip selects thereby allowing the user to use the available chip select pins, e.g., on SRAMs, more efficiently when a bank of SRAMs are used for depth expansion. In this embodiment of the present invention, SRAMs are referred to often as the addressed device. However, the embodiments of the present invention are equally pertinent to any integrated circuit device capable of being addressed by chip select signals.

This embodiment of the present invention addresses the problems associated with chip selects by configuring the chip selects of each of the SRAMs independently. This is exemplified in that, if four SRAMs are to be used in a bank, only 2 chip selects are needed. A third chip select is needed for controlling the whole bank. In this way, only (n+1) chip selects are needed, where 'n' is the number of times the memory needs to be doubled in a compounded fashion, as opposed to (2n+1) chip selects required in earlier practice. This advantageous result is derived by allowing the assertion level (high or low) of each chip select of each device to be independently programmed.

Figure 1:
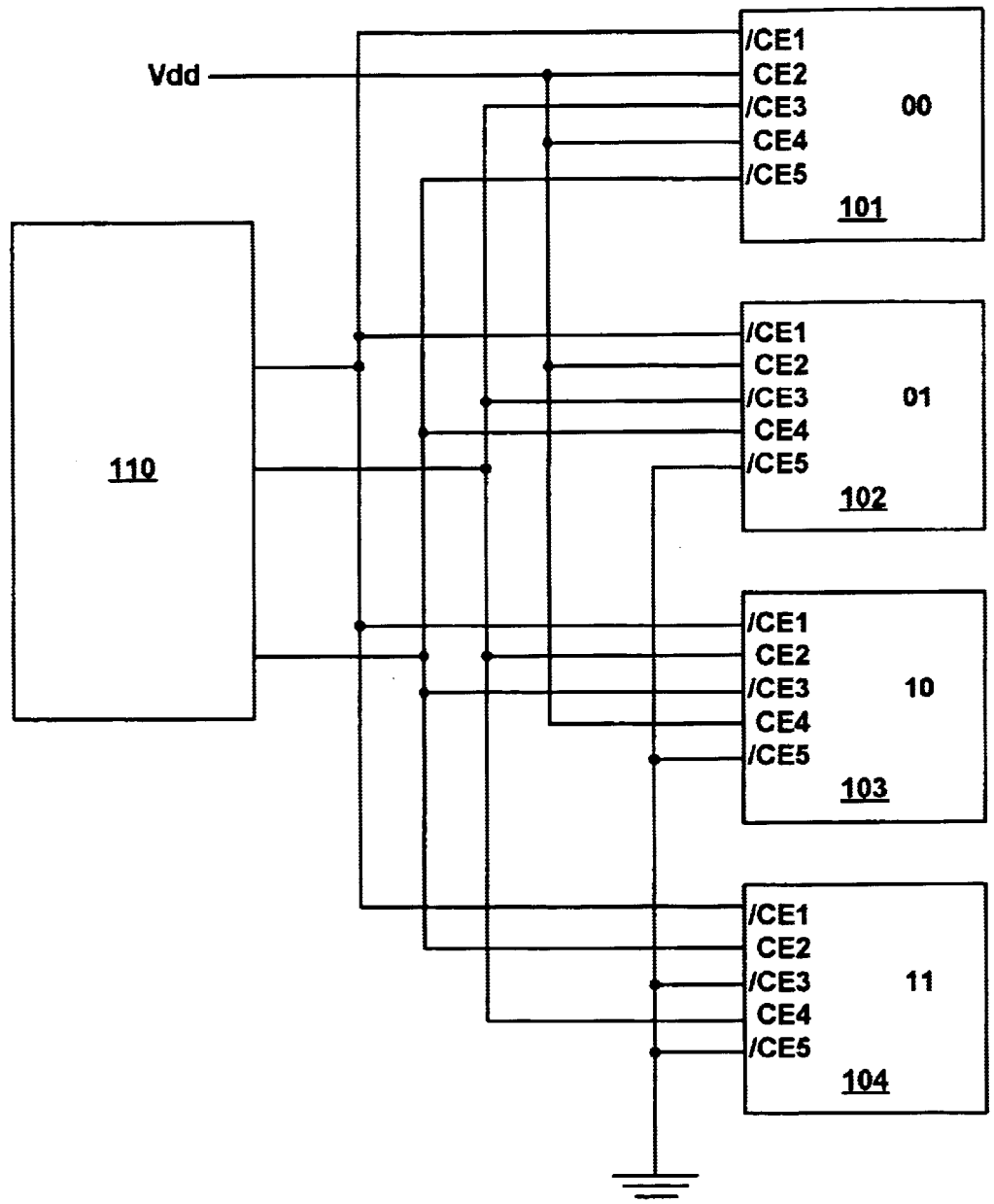
FIG. 1 (conventional art) illustrates a four chip memory array requiring five chip selects.
Figure 2:
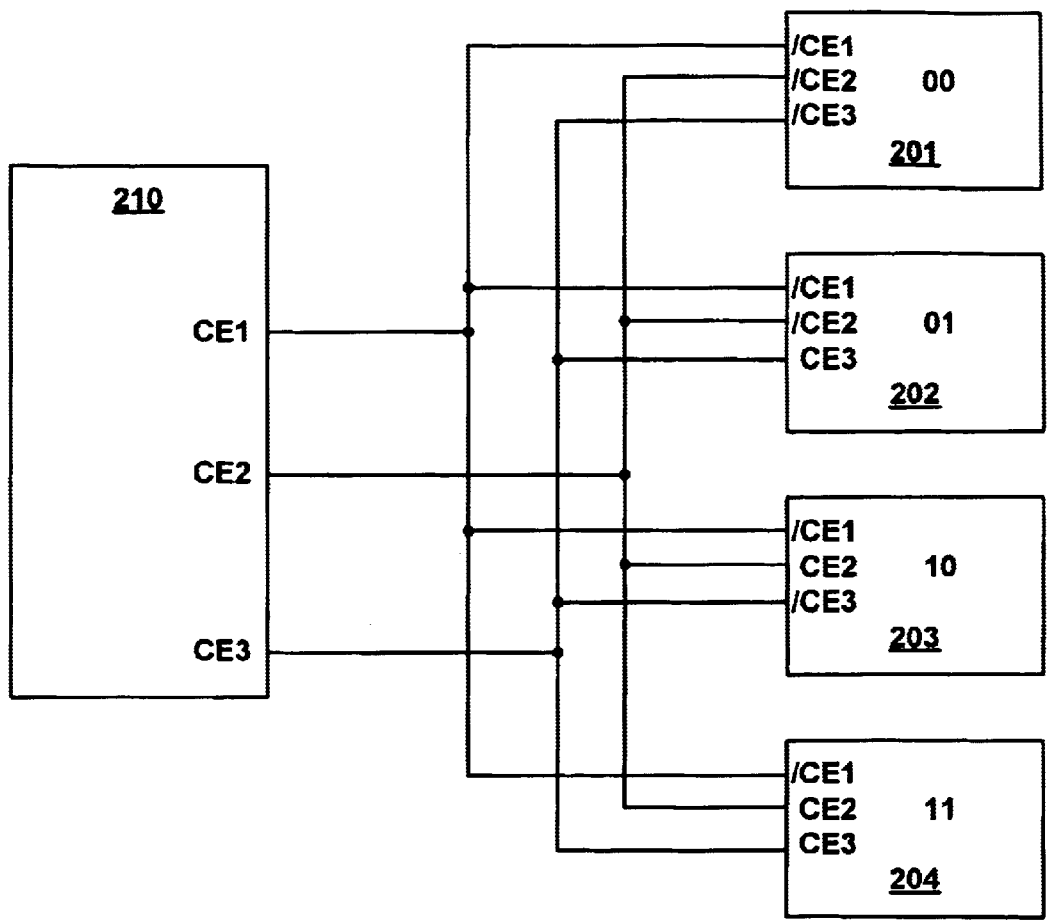
FIG. 2 illustrates a memory and chip selects in accordance with an embodiment of the present invention.

FIG. 2 illustrates an example of three chip selects being used for controlling four SRAMs (having configurable chip select levels) in this embodiment of the present invention. Memory controller 210 is enabled to output three chip select signals, CE1, CE2, and CE3. Each memory chip, 201 to 204, is enabled to receive three chip select inputs, CE1, CE2 and CE3 for addressing. In memory chip 201, all three chip selects are configured as active low, illustrated as /CE1, /CE2 and /CE3. This enables chip 201 to be selected when all three chip select outputs from controller 210 are low or "0". As illustrated, chip 201 is selected when the memory address word is 000.

Memory chip 202 is configured differently from chip 201 with two active low and one active high chip select, /CE1, /CE2, and CE3 leading to selection when the address word is 001. Similarly, chip selects in memory chips 203 and 204 are individually configured to provide selection upon receiving words 010 and 011, respectively. It is appreciated that each memory chip was separately programmed with the chip select levels shown in FIG. 2 in order to implement the addressing scheme shown.

It is noted that memory chips 201–204 are illustrated with different configurations of chip selects. However, the memory cores of these chips themselves are virtually identical. The effective differential configuration of chip selects is accomplished within programmable elements of the memory chip.

Figure 3:
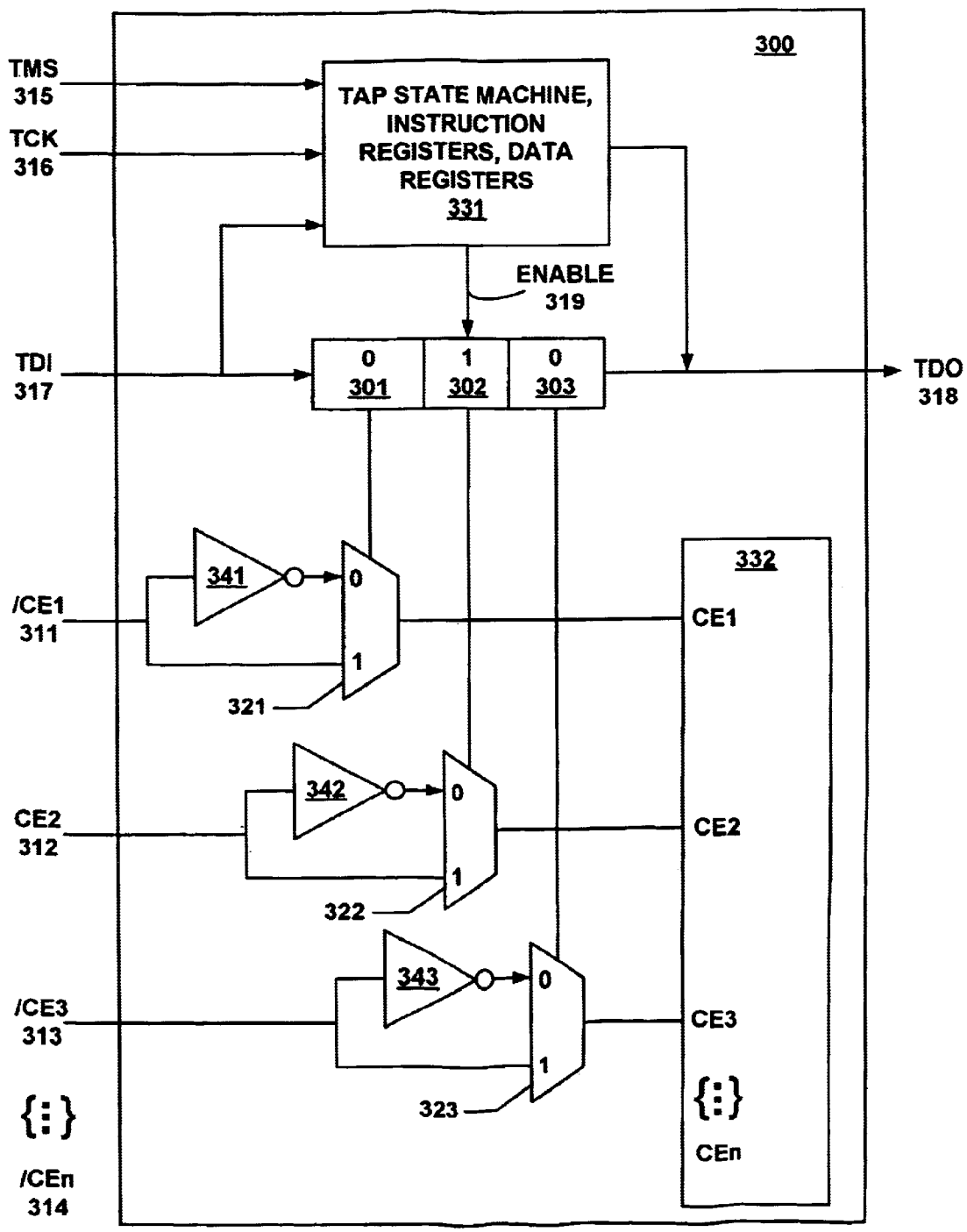
FIG. 3 illustrates a system for configuring and selecting chip selects in accordance with an embodiment of the present invention.

FIG. 3 illustrates the system that allows implementation of this embodiment of the present invention. Memory chip 300 shows memory core 332, which is an exemplary memory chip with any number of active-high chip selects. Note, to implement the four chip array of FIG. 2, there would need be only three chip selects. However, this embodiment of the present invention is not limited to a specific number of implementable memory chips.

It is noted here that the embodiment of the present invention shown in FIG. 3 is envisioned as being manufactured on a single chip, 300. Other embodiments can also be of single-chip manufacture.

Chip select signals coming from a memory controller, in this illustration, are CE1 at 311, CE2 at 312, and CE3 at 313. In other implementations, more chip selects can be accommodated as illustrated at CEn, 314. In this illustration, signal /CE1 and signal /CE3 are shown active low to enable the exemplary chip, 300. Each incoming chip select signal is coupled to a 2-into-1 multiplexer/driver (mux), 321–323. The mux sends either the incoming signal or the inverted incoming signal, depending on the status of its respective bit in the programmable data register, at 301–303.

As an example, signal CE1, 311, is received as a low, or 0. Because data bit 301 is set low, multiplexer/driver 321 transmits an inverse CE1, a high, which activates memory core 332's active-high chip select pin, CE1. Data bit 302 is set high so multiplexer/driver 322 transmits a non-inverted input signal and multiplexer/driver 323, whose data bit 303 is set low, transmits an inverted signal. In this fashion, the assertion levels of the chip select pins of memory chip 300 are effectively configured by setting data bits 301, 302 and 303 in the programmable data register.

In this embodiment of the present invention, configuration of the data register, and thus the chip selects, may be through the standard and well known IEEE JTAG port, illustrated in FIG. 3 under the control of the TAP (test access port) state machine 331. Since the JTAG operation is independent of the SRAM functionality, chip selects are configured on power up and the SRAM is used normally. It is appreciated that any of a number of methods could be used to configure the chip select levels.

Chip select pins are provided on this embodiment of the present invention and the state of a pin (active high/Active low) is set using the aforementioned JTAG port. This allows the chip selects to be configured externally.

The internal chip select pins shown in memory chip 300 are hardwired as either active high or active low depending upon initial design feasibility. The muxes, 321–323, connected to the internal pins, select between the active high or active low signal (through the inverter) coming from the system. The state of these signals is determined from the data stored in JTAG data register bits 301–303.

The data register bits, 301–303, used in the JTAG TAP circuitry is a user defined register. One of the reserved instructions which is not previously used on an existing synchronous SRAM may be used as an instruction code which enables the control of the user defined register. Though this embodiment of the present invention shows a three bit data register, other embodiments can use registers of any size 'n', where 'n' is the number of chip select pins on the configured device. In this embodiment, data from the register directly controls the muxes to select between the active high and active low signals.

In this embodiment, the use of a JTAG port requires the use of inputs 315 and 316, TMS and TCK, respectively. Data to be sent to the data register bits, 301–303, is input through TDI 317. Multiple devices can be configured simultaneously by being chained onto output TDO 318, under the JTAG standard. The data register is shown under the command of state machine 331 via enable 319.

As previously noted, this embodiment of the present invention is illustrated with three chip select pins. Other embodiments of the present invention can be implemented with any number of chip select pins as long as the system can support multiple SRAMs in a bank configuration.

The employment of embodiments of the present invention reduces the number of chip select pins for a given depth expansion scheme and allows better use of existing pins in that expansion. The ability to configure chip select pins externally, using the standard JTAG interface, offers flexibility to a system designer that was previously unavailable. The use of the multiplexers and buffers driving the chip select pins in this embodiment presents a negligible delay, resulting in little to no difference in memory operations.

Figure 4:
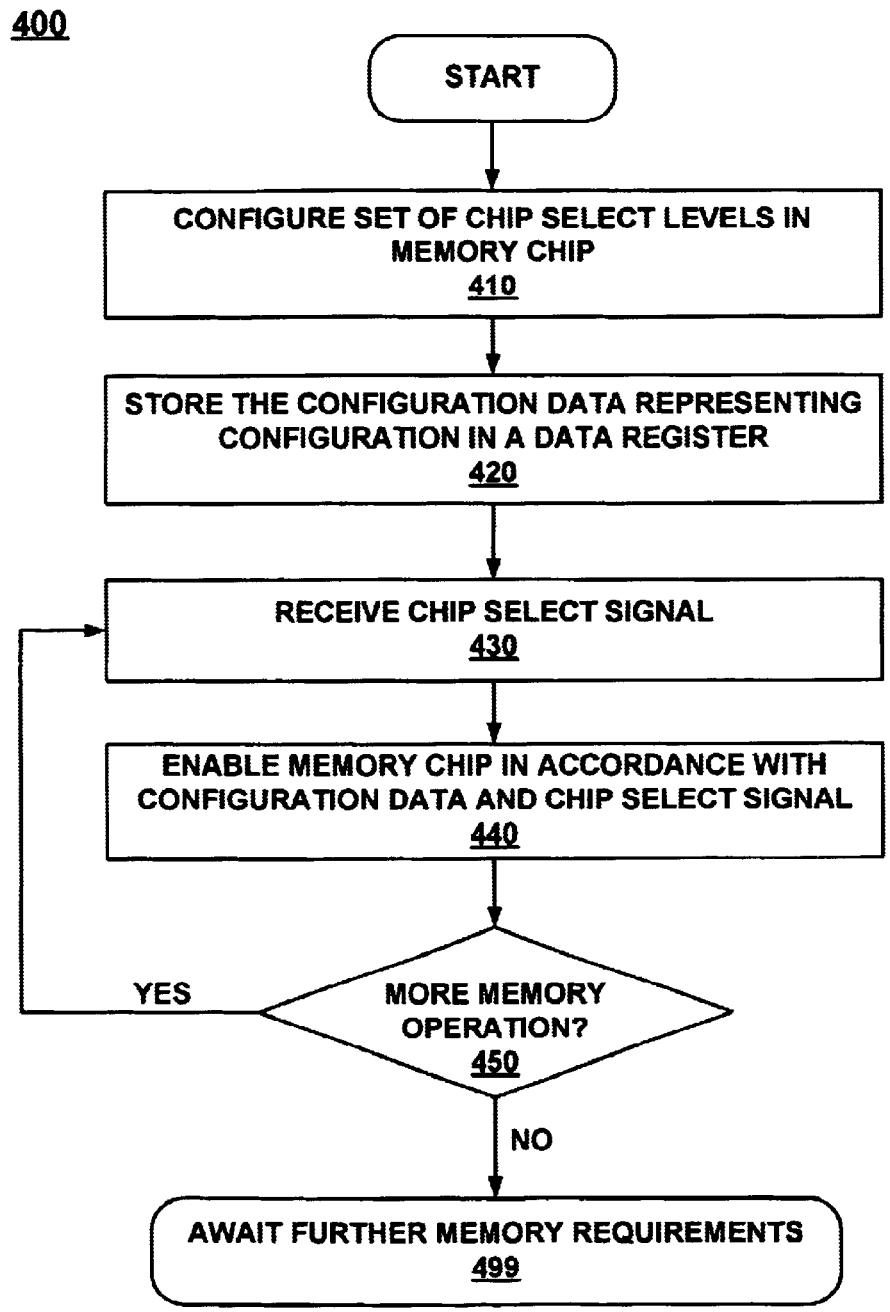
FIG. 4 illustrates an flow chart of a method for configuring and selecting chip selects in accordance with an embodiment of the present invention.

FIG. 4 illustrates a process for configuring chip select levels and enabling memory chip selects in accordance with this embodiment of the present invention. Process 400 starts at 410 with the configuration of a set of memory chip select levels. Data representing the configuration is stored, 420, in a pin-related bit series, in a data register.

Then, when a memory operation is needed, the chip select signal is received, from a memory controller, at 430. The chip select is enabled at 440 as determined by the stored configuration data and the incoming chip select signal. If no more memory operations are needed, 450, the process awaits further usage at 499.

The embodiment of the present invention described herein shows only one of several means of effectively pre-configuring chip selects in a memory array. Another means can be by providing permanently set strap pins or jumpers on the device whose position is read on device power up. The data from the strap position is then stored in the data register. Another option is to provide a permanent set of pins that directly connect high or low voltages to the muxes.

Most synchronous SRAMs are used in banks. By the implementation of embodiments of the present invention, users and designers are able to avoid implementing a memory decoder externally to a memory array. With the advantages presented in this description of embodiments of the present invention, there is no need for an external decoder.

It is noted here that a JTAG port is defined in an IEEE standard. By using the JTAG port, the means of configuring chip selects from the outside of a memory system is well established. A usercode instruction can be used to program an array of chip selects through a JTAG port.

Another advantage noted in these embodiments is more flexibility of memory design. Chip select signals need not be of the same type on all devices in a bank. The multiplexer/drivers can be designed to accommodate any necessary chip select signal level.

Using the concepts presented in this embodiment of the present invention, memory size can be increased with a smaller number of chip select lines for any given memory size. Only (n+1) chip select signals are needed, where 'n' is the number of times the memory chip count is doubled. Expressed differently, 'n' is the exponent of 2, where the chip count is $2^n$.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A method for addressing computer memory, comprising: configuring a set of chip select levels for a memory chip and forming configuration data representing said chip select levels; storing said configuration data in a programmable data register in said memory chip; receiving chip select signals at said memory chip; and enabling said memory chip in accordance with said configuration data and said chip select signals.

2. The method as described in claim 1, wherein said configuring comprises configuring said chip select levels to a chip-specific configuration with respect to a plurality of memory chips.

3. The method as described in claim 2, wherein said chip select levels are configured to states selected from active-high and active-low states.

4. The method as described in claim 3, wherein said chip select levels are configured differently between memory chips of a same memory bank.

5. The method as described in claim 3, wherein said chip select levels are controlled by said configuration data in said programmable data register.

6. The method as described in claim 1, wherein said programmable data register resides in a JTAG compliant circuit.

7. The method as described in claim 6, wherein said programmable data register is user defined.

8. An integrated computer memory chip, comprising: a memory core; a circuit for controlling chip select levels of said memory chip and for receiving chip select signals; and a programmable data register for storing configuration data for configuring said circuit, wherein said chip select levels are adapted to be configured individually for said memory chip among a plurality of memory chips of a bank of memory.

9. The computer memory chip as described in claim 8, wherein said computer memory chip is an SRAM device.

10. The computer memory chip as described in claim 8, wherein said chip select levels are configured in said programmable data register.

11. The computer memory chip as described in claim 8, wherein said chip select levels are configured by said configuration data.

12. The computer memory chip as described in claim 8 wherein said circuit for controlling chip select levels comprises a plurality of multiplexers, each multiplexer receiving a chip select signal and an inverted chip select signal and each multiplexer controlled by a respective bit of said programmable data register.

13. The computer memory chip as described in claim 12 wherein outputs of said plurality of multiplexers are coupled to chip enables of said memory core for enabling thereof.

14. The computer memory chip as described in claim 12 wherein said circuit for controlling chip select levels further comprises a plurality of inverter gates for generating the inverted chip selects.

15. An electronic system comprising: a controller for generating a plurality of chip select signals; and a plurality of integrated circuit devices coupled to, and addressed by, said plurality of chip select signals, wherein each integrated circuit device comprises: a plurality of programmable chip enable inputs, wherein each chip enable input has a programmable assertion level which is maintained internally by each integrated circuit device.

16. An electronic system as described in claim 15 wherein said plurality of integrated circuit devices are memory chips.

17. An electronic system as described in claim 15 wherein each integrated circuit device further comprises a programmable configuration register for storing data representing programmable assertion levels of said plurality of programmable chip enable inputs.

18. An electronic system as described in claim 17 wherein each integrated circuit device further comprises logic for implementing said programmable assertion levels of said plurality of programmable chip enable inputs, said logic coupled to said programmable configuration register.

19. An electronic system as described in claim 18 wherein said logic comprises a plurality of multiplexers, each multiplexer corresponding to a respective programmable chip enable input.

20. An electronic system as described in claim 15 wherein said plurality of programmable chip enable inputs are programmable via a JTAG input port of each integrated circuit device.

* * * * *